US008957389B2

(12) United States Patent
Yamada

(10) Patent No.: US 8,957,389 B2
(45) Date of Patent: Feb. 17, 2015

(54) ELECTROMAGNETIC LENS FOR ELECTRON BEAM EXPOSURE APPARATUS

(71) Applicant: Advantest Corporation, Tokyo (JP)

(72) Inventor: Akio Yamada, Tokyo (JP)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 14/090,943

(22) Filed: Nov. 26, 2013

(65) Prior Publication Data

US 2014/0166893 A1 Jun. 19, 2014

(30) Foreign Application Priority Data

Dec. 14, 2012 (JP) ................................. 2012-273068

(51) Int. Cl.
*H01J 37/141* (2006.01)
(52) U.S. Cl.
CPC ....... *H01J 37/141* (2013.01); *H01J 2237/1405* (2013.01)
USPC .................................................. 250/396 ML
(58) Field of Classification Search
CPC ...................................................... H01J 37/141
USPC ........ 250/396 R, 396 ML; 335/210, 213, 214
See application file for complete search history.

(56) References Cited

U.S. PATENT DOCUMENTS

| 6,194,729 B1* | 2/2001 | Weimer | 250/396 ML |
| 2008/0224062 A1* | 9/2008 | Adamec | 250/396 ML |

FOREIGN PATENT DOCUMENTS

| JP | 2001-110351 | 4/2001 |
| JP | 2007-311117 | 11/2007 |
| WO | WO 2012/057166 | 5/2012 |

OTHER PUBLICATIONS

Office action issued by Japanese Patent Office for the counterpart Japanese application and its English translation.

* cited by examiner

*Primary Examiner* — Jack Berman
*Assistant Examiner* — Eliza Osenbaugh-Stewart
(74) *Attorney, Agent, or Firm* — Muramatsu & Associates

(57) ABSTRACT

There is provided an electromagnetic lens which includes an electromagnetic coil wound to be rotationally symmetrical about an optical axis of an electron beam, and a pole piece covering the electromagnetic coil, in which: a gap is integrally formed in either one of an inner wall formed at an inner circumference side of the pole piece and a lower end wall formed in an end portion at an emission side of the electron beam, or a boundary portion between the two walls; the inner wall is formed to be thinnest at a portion close to the gap and to gradually become thicker as a distance from the gap increases; and the electromagnetic lens is formed such that a width in a radial direction thereof is more increased as being closer to the gap along with the change of the thickness of the inner wall.

10 Claims, 10 Drawing Sheets

ELECTROMAGNETIC LENS FOR ELECTRON BEAM EXPOSURE APPARATUS

CROSS-REFERENCE TO RELATED APPLICATION

This application is based upon and claims the benefit of priority of the prior Japanese Application No. 2012-273068, filed on Dec. 14 2012, the entire contents of which are incorporated herein by reference.

TECHNICAL FIELD

The present invention relates to an electromagnetic lens for an electron beam exposure apparatus.

BACKGROUND ART

In an electron beam exposure apparatuses perform exposure in such a manner that an electron beam is emitted from an electron gun. The electron beam is let through a stencil mask with a rectangular aperture or an aperture having a predetermined pattern shape formed therein. Thereafter the electron beam is reduced in size at ¹/₂₀ for example by an electron optical system. Then the electron beam is projected onto a wafer.

For reducing the time required for the exposure, there is also proposed a multi-column type electron beam exposure apparatus which includes a plurality of electron beam columns (column cells), each of which a column cell is downsized and includes an electron gun and an electron optical system for projection of an electron beam. The multi-column electron beam exposure apparatus performs exposure in parallel using the plurality of column cells. Thus, the processing speed by the multi-column electron beam exposure apparatus is improved by a factor corresponding to the number of the electron beam columns, with respect to that of an electron beam exposure apparatus which uses a single column cell.

For further improving throughput, the number of column cells in the electron beam exposure apparatus is preferably increased, and further downsizing of the electron beam column is demanded.

PATENT DOCUMENT 1: Japanese Laid-open Patent Publication No. 2001-110351

SUMMARY OF INVENTION

Problems to be Solved

For downsizing of an electron beam column, an outer diameter of an electromagnetic lens for converging an electron beam needs to be reduced.

However, the reduction of the outer diameter of the electromagnetic lens results in downsizing of an electromagnetic coil included in the electromagnetic lens and a shortage of the winding number of the electromagnetic coil. As a result, a larger current is required to generate a desired magnetic field. The larger current causes a problem of an increased amount of heat generated by the electromagnetic coil.

Moreover, when an electromagnetic lens is formed in a shape elongated so as to increase the winding number of the electromagnetic coil, magnetic saturation occurs in a pole piece covering the electromagnetic coil, thereby failing to generate a desired magnetic field.

Therefore, an object is to provide an electromagnetic lens for an electron beam exposure apparatus which can generate a desired magnetic field with the reduced outer diameter of the electromagnetic lens without increasing the amount of generated heat.

Means for Solving the Problem

According to one aspect, there is provided an electromagnetic lens which includes: an electromagnetic coil wound to be rotationally symmetrical about an optical axis of an electron beam; and a pole piece including an inner wall covering an inner circumference side of the electromagnetic coil, an upper end wall covering the electromagnetic coil at an entering side of the electron beam, a lower end wall covering the electromagnetic coil at an emitting side of the electron beam, an outer wall covering an outer circumference side of the electromagnetic coil, and a gap formed by cutting out at least a part of the inner wall, the lower end wall, and the upper end wall to be rotationally symmetrical about the optical axis. In the electromagnetic lens, a thickness of the inner wall is thinnest at a portion close to the gap and gradually becomes thicker as a distance from the gap increases, and a width of the electromagnetic coil in a radial direction is more increased as being closer to the gap.

Effect of the Invention

In the electromagnetic lens according to the abovementioned aspect, the inner wall has a thicker thickness at a portion that is away from the gap and is most likely to have a high magnetic flux density in the pole piece. This increases a portion through which the magnetic flux can pass in the inner wall to moderate an increase in the magnetic flux. Moreover, the thickness of the inner wall is gradually changed to allow the magnetic flux to smoothly flow through the inner wall, thereby making it possible to prevent a portion with the high magnetic flux density from being generated.

Accordingly, a pole piece having a shape long in the vertical direction can be employed, thereby making it possible to increase the winding number of the electromagnetic coil.

As a result, there can be obtained an electromagnetic lens which can generate a desired magnetic field with the reduced outer diameter thereof without increasing the amount of heat generated by the electromagnetic coil.

DESCRIPTION OF EMBODIMENTS

A prelude will be described prior to explanations of embodiments.

Figure 1A:
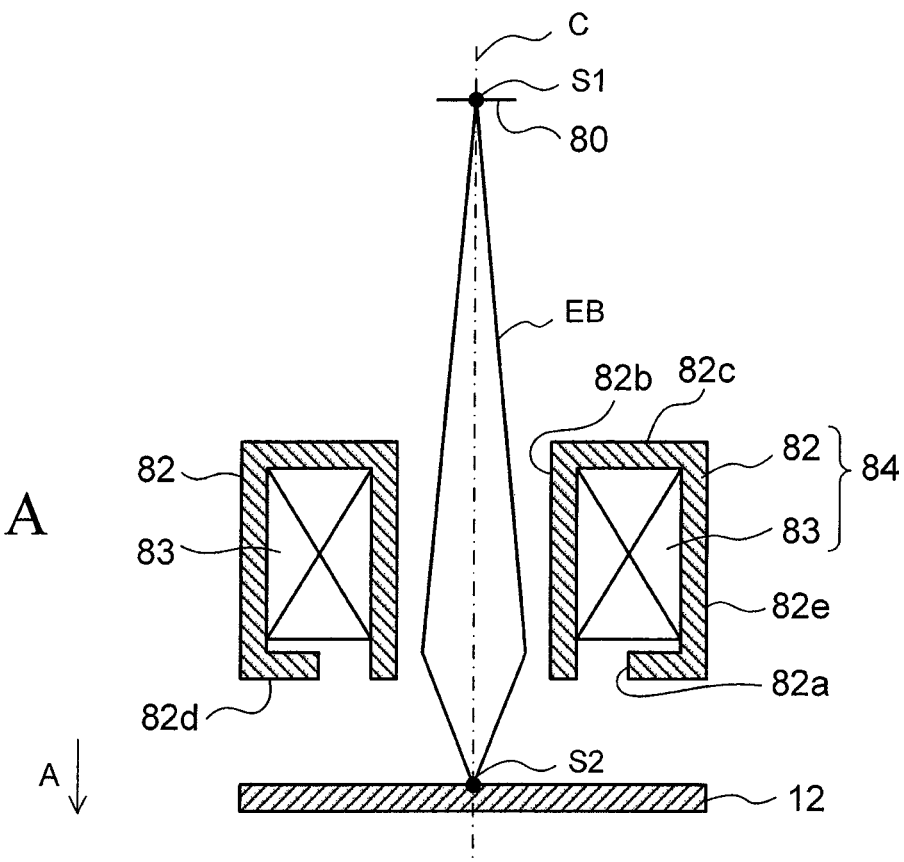
FIG. 1A is a cross-sectional view of an electromagnetic lens according to a prelude.
Figure 1B:
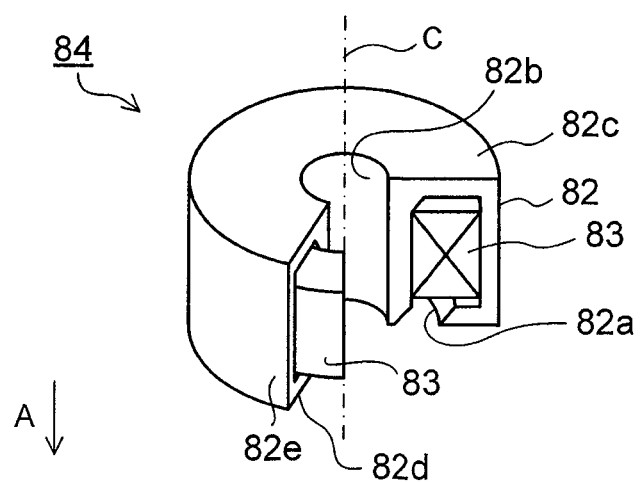
FIG. 1B is a perspective view illustrating the electromagnetic lens in FIG. 1A partially cut out.

FIG. 1A is a cross-sectional view illustrating an electromagnetic lens according to a prelude, and FIG. 1B is a perspective view illustrating the electromagnetic lens in FIG. 1A partially cut out. An arrow A in the drawings indicates the emission direction of electron beams.

An electromagnetic lens 84 illustrated in FIGS. 1A and 1B includes an electromagnetic coil 83 formed to be rotationally symmetrical about an optical axis c of an electron beam EB, and a pole piece 82 covers the surrounding of the electromagnetic coil 83.

The pole piece 82 includes an inner wall 82b formed on an inner circumference side portion thereof, an upper end wall 82c covering the electromagnetic coil 83 at an entering side of the electron beam EB, a lower end wall 82d covering the electromagnetic coil 83 at an emitting side of the electron beam EB, and an outer wall 82e covering an outer circumference side of the electromagnetic coil 83.

The electromagnetic lens 84 is an objective lens which converges the electron beam on the surface of a wafer 12 to be irradiated with the electron beam, and includes an annular gap 82a formed around the optical axis c in the lower end wall 82d to be opposed to the wafer 12.

A magnetic flux leaked from a magnetic pole of the electromagnetic coil 83 passes inside the pole piece 82 formed of a magnetic material is leaked outside from the gap 82a and generates a magnetic field above the wafer 12. An electron beam as an image S1 formed on an image plane 80 is converged by the magnetic field of the electromagnetic lens 84 while passing through a through-hole of the electromagnetic lens 84 to reach the surface (image plane) of the wafer 12. Thus, an image S2 is formed on the surface (image plane) of the wafer 12.

Meanwhile, a value of spherical aberration on the optical axis to determine the minimum size of the image S2 formed by the electromagnetic lens 84 is in proportion to $Cs\alpha^3$ where Cs [mm] denotes a spherical aberration coefficient of the electromagnetic lens 84 and $\alpha$ [rad] denotes an aperture angle of the electron beam EB. For obtaining the sufficient resolution, it is preferable to decrease the spherical aberration coefficient Cs in such a manner that the magnetic field generated by the electromagnetic lens 84 is localized around the surface of the wafer 12 and increased in strength.

For increasing the number of column cells, the electron beam exposure apparatus is required to have a reduced outer diameter of the electromagnetic lens while maintaining a predetermined spherical aberration coefficient Cs.

The reduced outer diameter of the electromagnetic lens 84 requires the downsizing of the electromagnetic coil 83. This poses a problem that the electromagnetic coil 83 is difficult to cool because the amount of generated heat increases due to the limited cross-section area of the winding portion of the electromagnetic coil 83.

To address this, various models with different shapes of the pole piece 82 and the electromagnetic coil 83 were created, the spherical aberration, the magnetomotive force, and the amount of generated heat of the electromagnetic lens 84, and the distribution of the magnetic flux density in the pole piece 82 were examined.

FIGS. 2A to 2D are views each illustrating a result of the distribution of the magnetic flux density in the pole piece obtained by calculation, for the electromagnetic lenses of various shapes. Note that, the cross sections in FIG. 2 are illustrated as cross-sectional views in which the electromagnetic lens 84 is taken along a plane in parallel with the optical axis c of the electron beam EB, the bottom side in each view is an optical axis c side, and the direction of the arrow in each view corresponds to the emission direction of the electron beam EB. Moreover, although the cross sections and the distributions of the magnetic flux density of the electromagnetic lens 84 appear rotationally symmetrical about the optical axis c, the other cross section across the optical axis c is not illustrated.

The calculation uses the electromagnetic lenses 84 downsized to have an outer diameter of $\phi$60 [mm] and having shapes in FIGS. 2A to 2D each including the electromagnetic coil 83 and the magnetic body pole piece 82, and obtained the magnetomotive force current of the electromagnetic coil 83, the current density in the magnetic body pole piece, and the like which are required to generate the lens magnetic field strength with which an electron beam at the acceleration voltage of 50 Kev can be converged onto a predetermined image surface by the electromagnetic lens 84. Moreover, under such conditions, the distribution of the magnetic flux density generated in the electromagnetic lens 84 and the surrounding thereof is obtained, and the spherical aberration coefficient Cs is obtained by the orbit calculation of the electron beam.

Figure 2A:
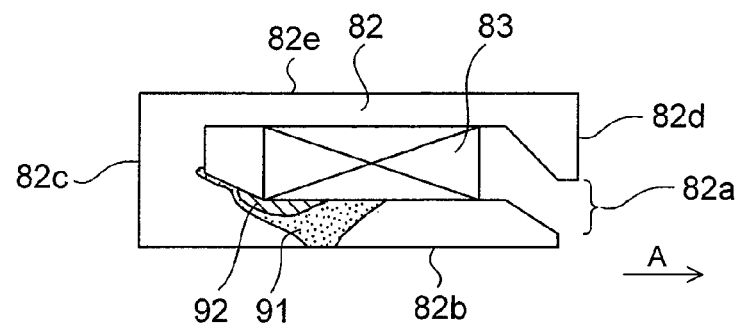
FIGS. 2A to 2D are views each illustrating a result of the distribution of the magnetic flux density in a pole piece obtained by calculation, for electromagnetic lenses of various shapes.

In the electromagnetic lens in FIG. 2A, a length of the pole piece 82 in the optical axis direction is set to 31 [mm], which is the longest among those of four examples of FIGS. 2A to 2D, in order to increase the winding number of the electromagnetic coil 83 without increasing the outer diameter of the electromagnetic lens 84.

A region 91 in the drawing is a region where the magnetic flux density reaches about 2.2 [T] (tesla) which is the saturated magnetic flux density of a magnetic body included in the pole piece 82, and a diagonally shaded region 92 is a region where the magnetic flux density exceeds 2.2 [T] (tesla) which is the saturated magnetic flux density of the magnetic body. Moreover, the other region with no sign is a region where the magnetic flux density is sufficiently lower than 2.2 [T] (tesla) which is the saturated magnetic flux density. Further, if the region 91 having a possibility of reaching the magnetic saturation, or the magnetically saturated region 92 appears over a whole region of the inner wall 82b of the pole piece 82 from the inner side (side close to the optical axis c) to the outer side (side close to the electromagnetic coil 83), the magnetic flux leaks from the pole piece 82 to disturb the orbit of the electron beam EB. Accordingly, the magnetomotive force of the electromagnetic coil 83 is limited by the magnetic saturation of the pole piece 82.

In the case in FIG. 2A, the magnetomotive force of the electromagnetic coil is 3022 [A·T] (ampere-turn), at which the amount of heat generated by the electromagnetic coil is 202 [W] and the spherical aberration coefficient Cs is 10.0 [mm].

Figure 2B:
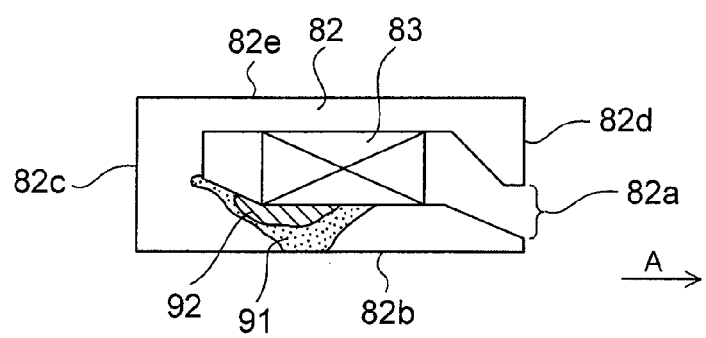

Meanwhile, FIG. 2B illustrates a calculation result where the length of the pole piece in the optical axis direction is set to 26 [mm] which is shorter than that of the pole piece in FIG. 2A.

In the electromagnetic lens in FIG. 2B, the magnetic saturation of the pole piece is less likely to occur because of the shorter length of the pole piece. As a result, the magnetomotive force of the electromagnetic coil-is 3438 [A·T] (ampere-turn), and the spherical aberration coefficient Cs decreases to 8.2 [mm]. However, the amount of heat generated by the electromagnetic coil 83 increases to 359 [W] because the electromagnetic coil 83 is downsized to decrease the winding number.

Figure 2C:
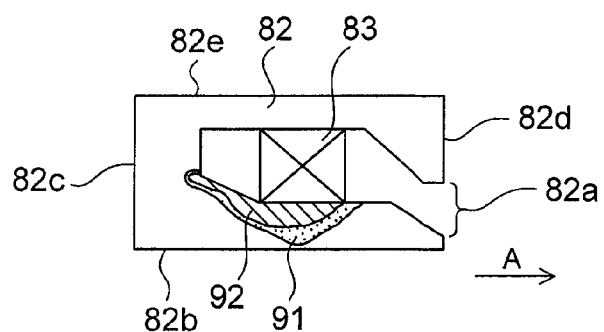

FIG. 2C illustrates a calculation result where the length of the pole piece of the electromagnetic lens is set to 21 [mm] which is shorter than that of the pole piece in FIG. 2B. The pole piece 82 in FIG. 2C is more unlikely to be magnetically saturated than the pole pieces 82 in FIGS. 2A and 2B. The magnetomotive force of the electromagnetic coil 83 is 3783 [A·T], and the spherical aberration coefficient Cs decreases to 6.7 [mm]. Meanwhile, the winding number of the electromagnetic coil 83 is further reduced compared with those of FIGS. 2A and 2B, and the magnetomotive force current is increased. Thus, the amount of heat generated by the electromagnetic coil 83 increases to 946 [W].

Figure 2D:
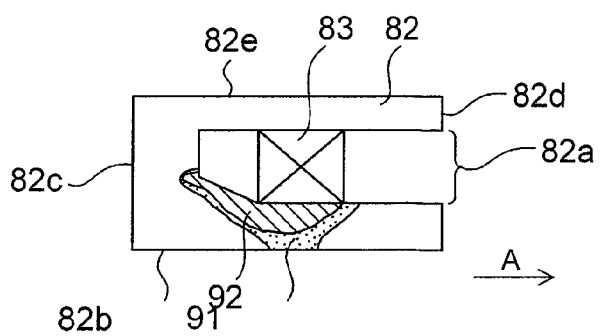

The electromagnetic lens in FIG. 2D has a wider gap than the electromagnetic lens in FIG. 2C while having the same length of the pole piece as the electromagnetic lens in FIG. 2C.

In this electromagnetic lens, the magnetomotive force of the electromagnetic coil 83 is 4882 [A·T], and the spherical aberration coefficient Cs decreases to 5.4 [mm].

However, the amount of heat generated by the electromagnetic coil 83 increases to 1850 [W].

Figure 3:
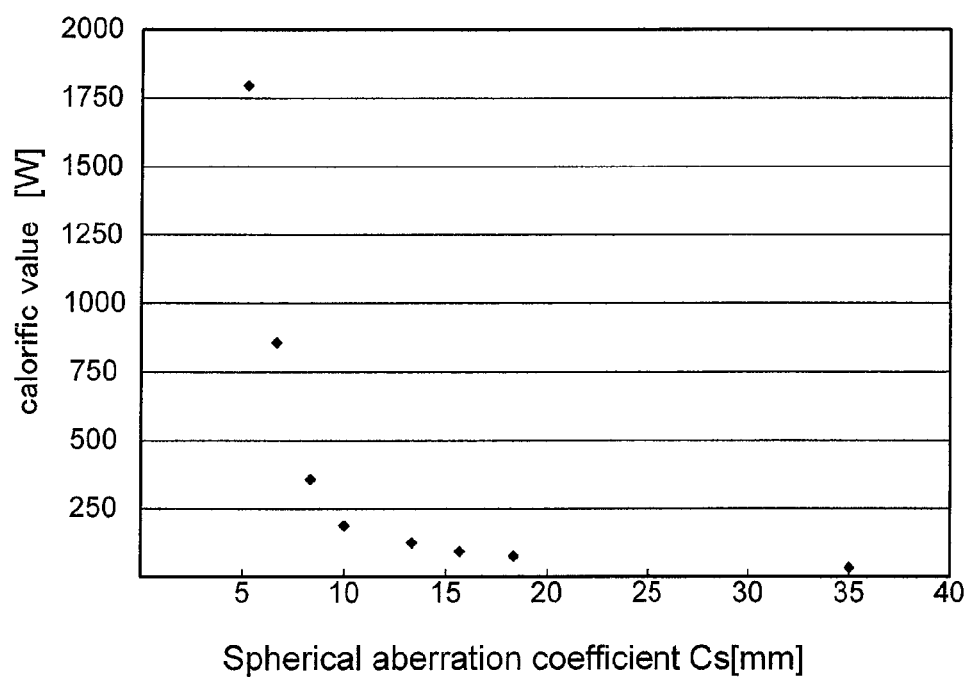
FIG. 3 is a graph illustrating a result of a relation between the spherical aberration coefficient of the electromagnetic lenses having been examined in the prelude and the amount of heat generated by the electromagnetic lenses.

FIG. 3 is a graph illustrating a result of a relation obtained between the spherical aberration coefficient of the electromagnetic lenses examined in the prelude and the amount of heat generated by them.

As illustrated in FIG. 3, it has revealed that the amount of heat generated by the electromagnetic coil abruptly increases as the spherical aberration coefficient of the electromagnetic lens is decreased.

For the purpose of solving a problem caused by such an abrupt increase in the amount of generated heat, an idea of embodiments described below has been arrived at.

(First Embodiment)

Figure 4A:
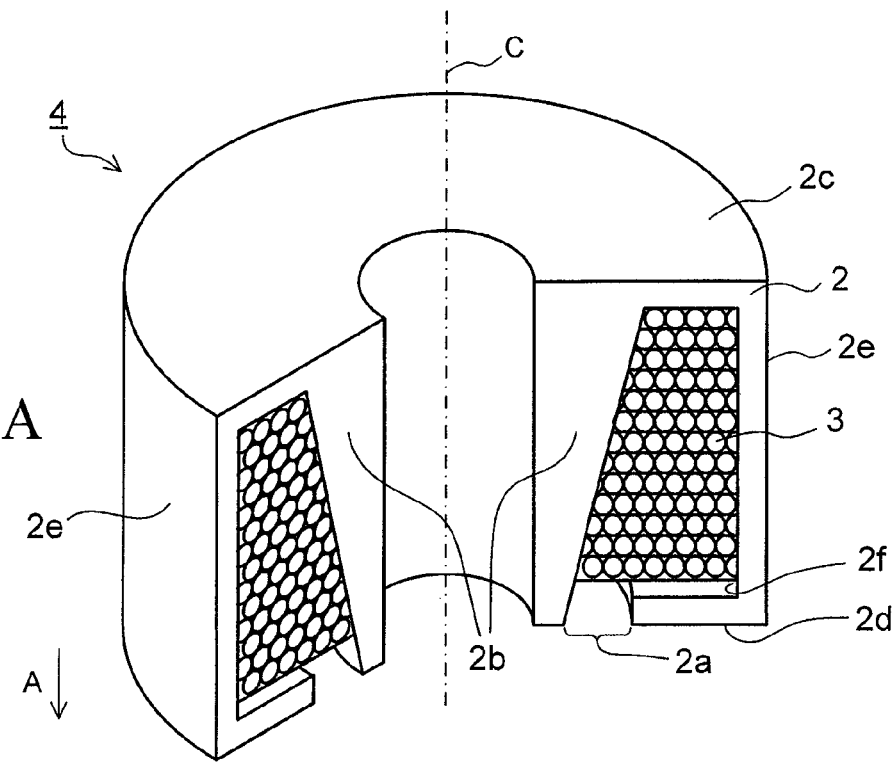
FIGS. 4A and 4B are perspective views illustrating an electromagnetic lens according to a first embodiment.
Figure 4B:
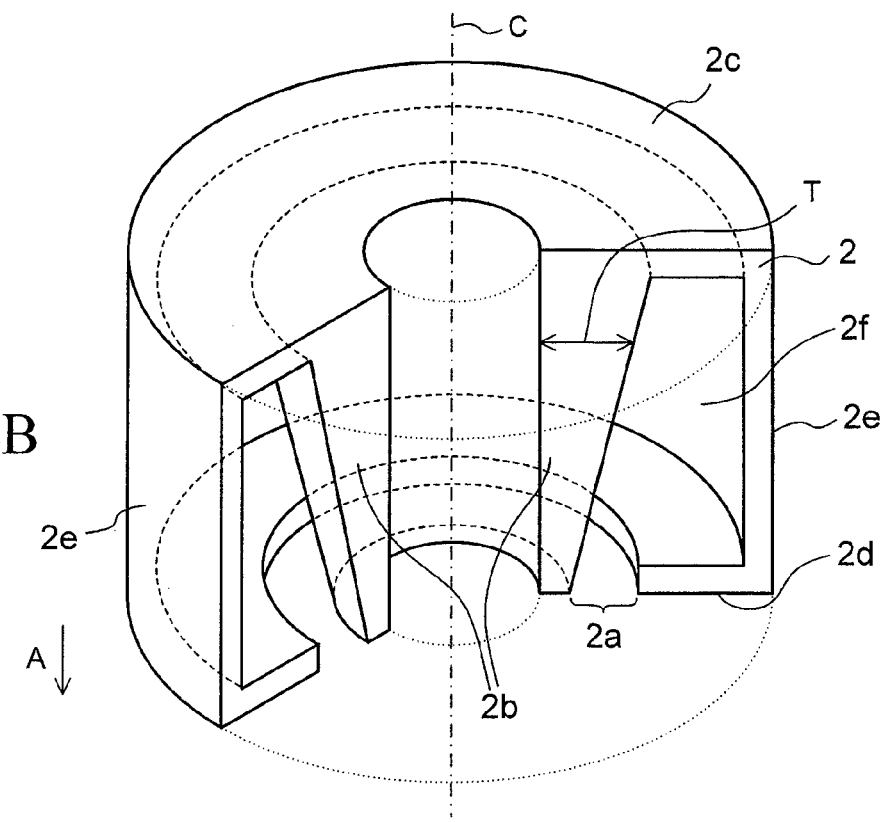

FIG. 4A is a perspective view illustrating an electromagnetic lens 4 according to a first embodiment, and FIG. 4B is a perspective view illustrating a pole piece 2 of the electromagnetic lens 4 in FIG. 4A. Note that FIGS. 4A and 4B illustrate them part of which is cut out for illustrating the inner structure. Moreover, a dashed dotted line in the drawings indicates an optical axis c of an electron beam EB which travels in the direction of an arrow in the drawing.

As illustrated in FIG. 4A, the electromagnetic lens 4 according to the embodiment is provided with an electromagnetic coil 3 formed around the optical axis c of the electron beam EB, and the pole piece 2 which covers the electromagnetic coil 3. The electromagnetic coil 3 and the pole piece 2 are respectively formed to be rotationally symmetrical about the optical axis c.

As illustrated in FIG. 4B, the pole piece 2 is formed of a soft magnetic material having a relatively high saturated magnetic flux density. The pole piece 2 includes an inner wall 2b formed at an inner circumference side near the optical axis c, an upper end wall 2c formed on an end portion at an entering side of the electron beam EB, a lower end wall 2d formed on an end portion at an emitting side of the electron beam EB, and a cylindrical outer wall 2e connected to peripheral portions of the upper end wall 2c and the lower end wall 2d. Further, a coil housing unit 2f is formed in a portion surrounded by the inner wall 2b, the upper end wall 2c, the lower end wall 2d, and the outer wall 2e, of the pole piece 2.

Moreover, the pole piece 2 includes a gap 2a formed such that a part of the lower end wall 2d is cut out in a circular shape around the optical axis c. A magnetic flux is leaked from the portion of the gap 2a to generate a magnetic field for causing the electron beam to be converged above a sample (not illustrated) as a target to be irradiated with the electron beam EB.

In the pole piece 2 according to the embodiment, the thickness (thickness of a portion T in the drawing) of the inner wall 2b in the radial direction of the optical axis c gradually increases as being away from the gap 2a.

This increases the thickness of the inner wall 2b at a portion away from the gap 2a which is likely to be magnetically saturated in the pole piece 2, thereby inhibiting magnetic saturation in the inner wall 2b.

Moreover, the thickness of the inner wall 2b gradually changes toward the gap 2a to allow the magnetic flux to smoothly pass through the inner wall 2b and to prevent the density of the magnetic flux from locally increasing. Thus, the magnetic saturation is more unlikely to occur.

As a result, even if the length of the pole piece 2 in the optical axis direction is increased, the magnetic saturation is unlikely to occur. Thus, the electromagnetic coil 3 having a larger winding number can be used with the length of the pole piece 2 in the optical axis direction increased.

In addition, as illustrated in FIG. 4A, the electromagnetic coil 3 is formed to have a trapezoidal cross section, and a width of the electromagnetic coil 3 in the radial direction gradually increases as being close to the gap 2a, in the electromagnetic lens 4.

This allows the electromagnetic coil 3 to be wound in a large area on an inner side (side near the optical axis), compared with a case where the electromagnetic coil 3 is formed in a cylindrical shape having a rectangular cross section.

As a result, the magnetomotive force by the electromagnetic coil 3 can be increased while the amount of heat generated by the electromagnetic coil 3 is reduced. Thus, even though the electromagnetic lens 3 is downsized, it is possible to reduce the spherical aberration coefficient Cs while inhibiting the heat generation.

Figure 5A:
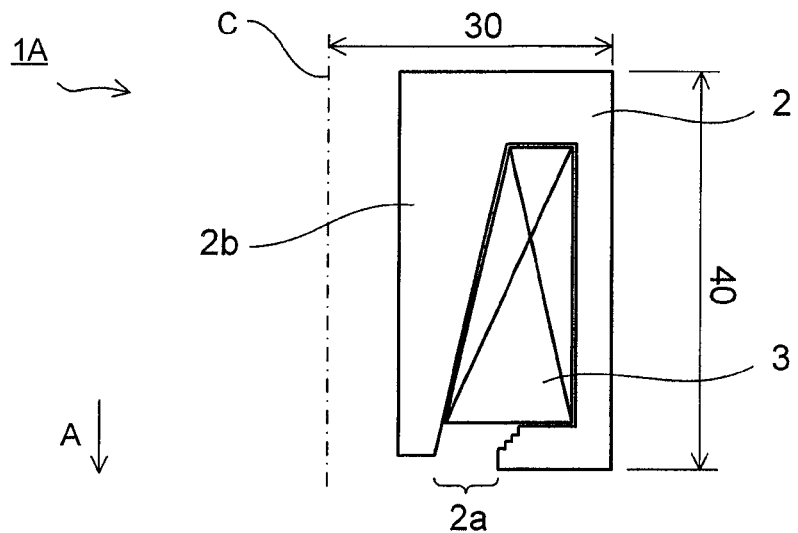
FIG. 5A is a cross-sectional view of an electromagnetic lens according to an example 1 in the first embodiment.
Figure 5B:
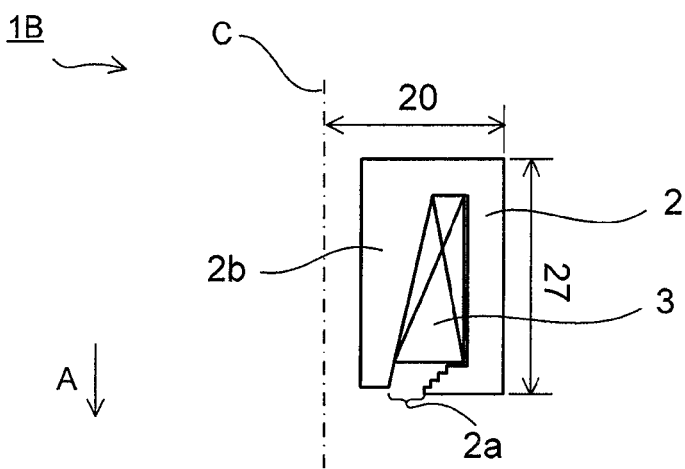
FIG. 5B is a cross-sectional view of an electromagnetic lens according to an example 2 in the first embodiment.
Figure 5C:
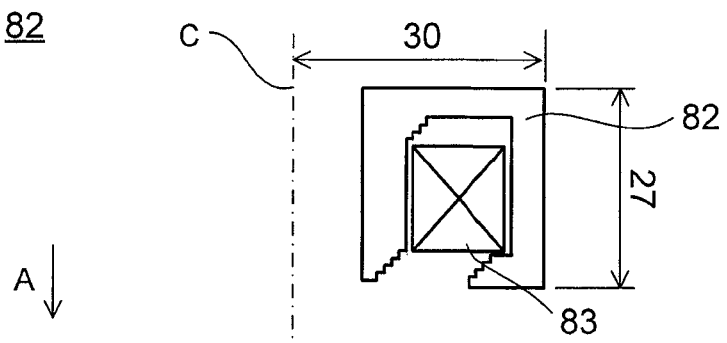
FIG. 5C is a cross-sectional view of an electromagnetic lens according to a comparative example.

FIG. 5A is a cross-sectional view of an electromagnetic lens 1A according to a first example in the first embodiment, FIG. 5B is a cross-sectional view of an electromagnetic lens 1B according to an example 2 in the first embodiment, and FIG. 5C is a cross-sectional view of an electromagnetic lens 84 according to a comparative example. One of the cross sections of the electromagnetic lens is illustrated in each of the drawings. Moreover, the numeric characters in the drawings indicate sizes [mm] of the respective electromagnetic lenses.

The electromagnetic lens 1A in the example 1 illustrated in FIG. 5A has an outer diameter of $\phi60$ [mm].

The electromagnetic lens 1A has a length in the optical axis direction of 40 [mm] which is longer than that of the electromagnetic lens illustrated in FIG. 2A. The winding number of the electromagnetic coil 3 in which a conductive wire having a diameter of 0.5 [mm] is used is 893 turns.

Moreover, the electromagnetic lens 1B in the example 2 illustrated in FIG. 5B has a reduced outer diameter of $\phi40$

[mm] compared with the outer diameter of the electromagnetic lens 1A in FIG. 5A. The winding number of the electromagnetic coil 3 in which a conductive wire having a diameter of 0.5 [mm] is used is 416 turns.

Meanwhile, an electromagnetic lens 84 in the comparative example illustrated in FIG. 5C has a structure similar to that of the electromagnetic lens in FIG. 2C, and has an outer diameter of φ60 [mm] and a length in the optical axis direction of 27 [mm].

Next, description will be provided for results of the distribution of the magnetic flux density in the pole piece obtained by calculation under the conditions in which predetermined spherical aberration coefficients Cs for the electromagnetic lenses 1A, 1B, and 84 can be obtained.

Figure 6A:
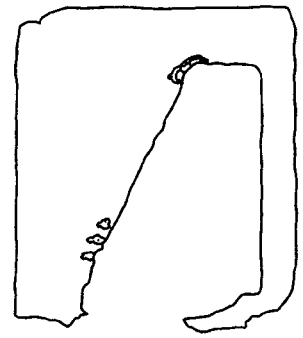
FIGS. 6A to 6C are views each illustrating a result of the distribution of the magnetic flux density in the pole piece obtained by calculation, for the electromagnetic lenses in FIG. 5A to 5C.
Figure 6B:
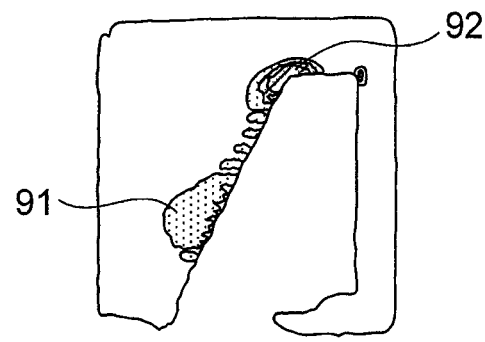
Figure 6C:
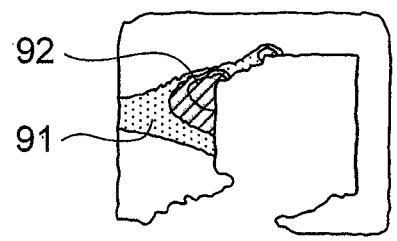

FIGS. 6A to 6C are views each illustrating a result of the distribution of the magnetic flux density in the pole piece obtained by calculation for the electromagnetic lenses 1A, 1B, and 84 in FIGS. 5A to 5C.

FIG. 6A illustrates the distribution of the magnetic flux density in the pole piece 2 of the electromagnetic lens 1A (example 1) in FIG. 5A. In the electromagnetic lens 1A in the example 1, the spherical aberration coefficient Cs of 7.5 [mm] is obtained when the magnetomotive force of the electromagnetic coil is 3521 [A·T] (ampere-turn), and the amount of generated heat is 162 [W] under these conditions.

Moreover, as illustrated in the drawing, a portion where the magnetic flux density exceeds the saturated magnetic flux density is hardly generated in the pole piece 2. Thus, this result confirms that the magnetic saturation can be effectively inhibited.

FIG. 6B illustrates the distribution of the magnetic flux density in the pole piece 2 of the electromagnetic lens 1B (example 2) in FIG. 5B. In the electromagnetic lens 1B in the example 2, the spherical aberration coefficient Cs of 7.5 [mm] is obtained when the magnetomotive force of the electromagnetic coil is 2983 [A·T] (ampere-turn), the amount of generated heat is 167 [W] under these conditions.

As illustrated in the drawing, a portion where the magnetic flux density exceeds the saturated magnetic flux density is only partially generated in the pole piece 2, and the magnetic flux is not leaked to the optical axis side of the electron beam.

The above result confirms that even the electromagnetic lens 1B in the example 2 with the reduced outer diameter of about 40 [mm] can inhibit the magnetic saturation and prevent the amount of generated heat from increasing.

FIG. 6C illustrates the distribution of the magnetic flux density in the pole piece of the electromagnetic lens 84 (comparative example). The electromagnetic lens 84 in the comparative example has a length of the pole piece in the optical axis direction of 27 [mm] which is shorter than that of the electromagnetic lens 1A in FIG. 6A. Regardless of the shorter length, when the magnetomotive force of the electromagnetic coil is 3158 [A·T] (ampere-turn), the region 91 where the magnetic flux density reaches the saturated magnetic flux density is generated over a whole region of the inner wall of the pole piece 2 in the thickness direction. The spherical aberration coefficient Cs in this case remains at 10 [mm], and the amount of generated heat is 202 [W] which is increased compared with those of the electromagnetic lenses 1A and 1B in the examples.

The above results confirm that, with the electromagnetic lenses 1A and 1B according to the embodiment, the desired spherical aberration coefficient Cs can be obtained even if the outer diameter thereof is downsized, and the heat generation by the electromagnetic coil can be effectively reduced.

(Second Embodiment)

Figure 7:
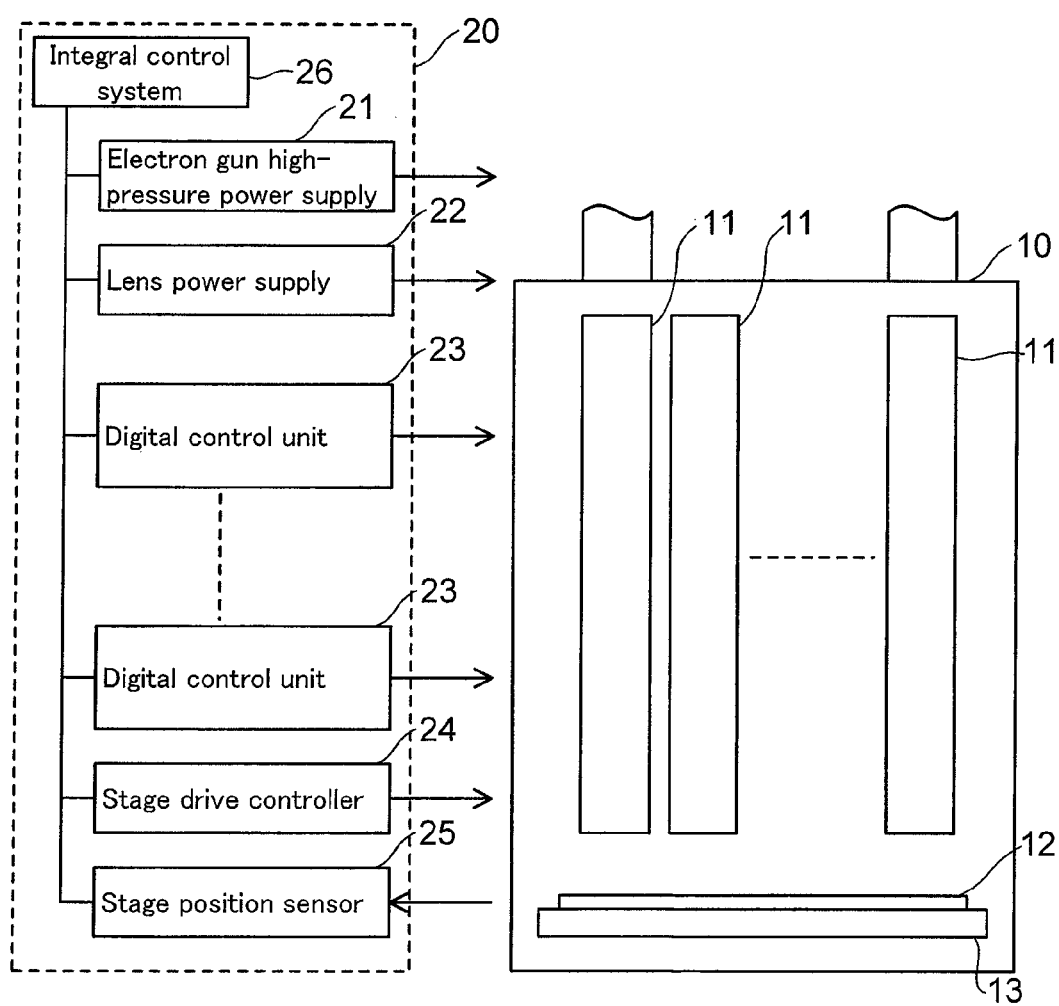
FIG. 7 is a block diagram of an electron beam exposure apparatus according to a second embodiment.

FIG. 7 is a schematic configuration view of a multi-column electron beam exposure apparatus according to a present embodiment.

The multi-column electron beam exposure apparatus is roughly divided into an electron beam column 10, and a control unit 20 which controls the electron beam column 10. Between them, the electron beam column 10 includes a plurality of, for example 16, equivalent column cells 11 which constitute the overall column. All the column cells 11 are configured to include equivalent units. Below the column cells 11, a wafer stage 13 on which a wafer 12 of 300 [mm] is mounted is disposed for example.

Meanwhile, the control unit 20 includes an electron gun high-pressure power supply 21, a lens power supply 22, a digital control unit 23, a stage drive controller 24, and a stage position sensor 25. Among them, the electron gun high-pressure power supply 21 supplies power for driving an electron gun in each of the column cells 11 in the electron beam column 10. The lens power supply 22 supplies power for driving an electromagnetic lens in each of the column cells in the electron beam column 10. The digital control unit 23 is an electric circuit which controls deflection outputs from deflectors in each of the column cells 11, and outputs a high-speed deflection output and the like. The digital control units 23 are prepared as many as the number of the column cells 11.

The stage drive controller 24 moves the wafer stage 13 on the basis of position information from the stage position sensor 25 in such a manner that a desired position on the wafer 12 is irradiated with the electron beam. The abovementioned respective units 21 to 25 are integrally controlled by an integral control system 26 such as a work station.

Figure 8:
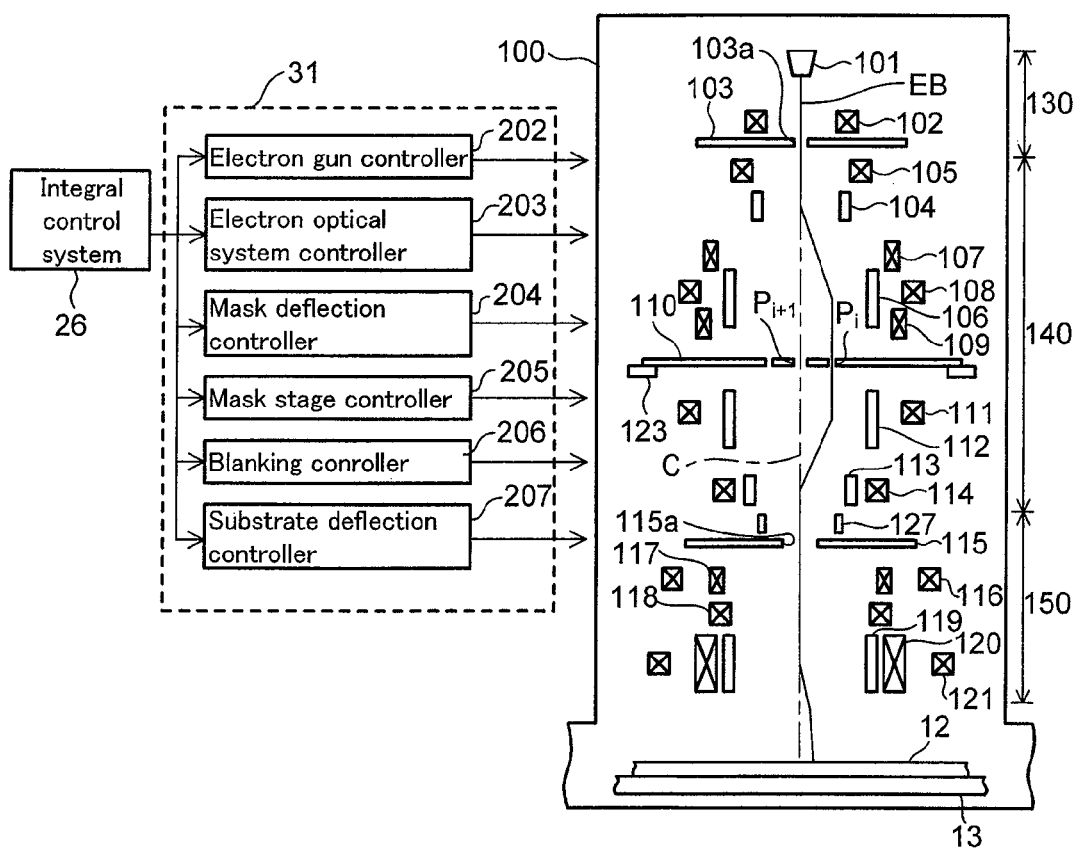
FIG. 8 is a block diagram illustrating one column cell in FIG. 7.

FIG. 8 is a schematic configuration view of each column cell 11 used in the multi-column electron beam exposure apparatus.

Each column cell 11 is roughly divided into an exposure unit 100, and a column cell control unit 31 which controls the exposure unit 100. Between them, the exposure unit 100 is configured to include an electron beam generation unit 130, a mask deflection unit 140, and a substrate deflection unit 150.

In the electron beam generation unit 130, an electron beam EB generated by an electron gun 101 is subjected to a convergence action by a first electromagnetic lens 102, and then passes through a rectangular aperture 103a in a beam forming mask 103 to shape a cross section of the electron beam EB into a rectangle.

Thereafter, an image of the electron beam EB is formed on an exposure mask 110 by a second electromagnetic lens 105 in the mask deflection unit 140. Further, the electron beam EB is deflected by first and second electrostatic deflectors 104 and 106 to a particular pattern P formed in the exposure mask 110 to shape the cross section thereof into a shape of the pattern P.

Further, the exposure mask 110 is fixed to a mask stage 123 in the electron beam column 10, and the mask stage 123 is movable in the horizontal plane. Accordingly, when the pattern P positioned at a portion out of a deflection range (beam deflection range) of the first and second electrostatic deflectors 104 and 106 is used, the mask stage 123 is moved so that the pattern P is moved into the beam deflection range.

Third and fourth electromagnetic lenses 108 and 111 respectively disposed above and below the exposure mask 110 function to form an image of the electron beam EB on a substrate.

The electron beam EB passed through the exposure mask 110 is deflected back to the optical axis c due to deflection actions by third and fourth electrostatic deflectors 112 and 113, and then is reduced in size by a fifth electromagnetic lens 114.

The mask deflection unit 140 is provided with first and second correction coils 107 and 109, which correct beam deflection aberration generated in the first to fourth electrostatic deflectors 104, 106, 112, and 113.

Thereafter, the electron beam EB passes through an aperture 115a in a screening plate 115 which constitutes the substrate deflection unit 150, and is projected on the substrate by first and second projection electromagnetic lenses 116 and 121. In this manner, the image of the pattern on the exposure mask 110 is transferred onto the substrate at a predetermined reduction ratio, for example, 1/10.

The substrate deflection unit 150 provided with a fifth electrostatic deflector 119 and an electromagnetic deflector 120, and these deflectors 119 and 120 deflect the electron beam EB to allow the image of the pattern on the exposure mask to be projected on a predetermined position of the substrate.

In addition, the substrate deflection unit 150 is provided with third and fourth correction coils 117 and 118 for correcting the deflection aberration of the electron beam EB on the substrate.

Meanwhile, the column cell control unit 31 includes an electron gun control unit 202, an electron optical system control unit 203, a mask deflection control unit 204, a mask stage control unit 205, a blanking control unit 206, and a substrate deflection control unit 207. Among them, the electron gun control unit 202 controls the electron gun 101 to control the acceleration voltage of the electron beam EB, the beam emission conditions, or the like. Moreover, the electron optical system control unit 203 controls the amounts of currents into the electromagnetic lenses 102, 105, 108, 111, 114, 116, and 121 to adjust the magnification or the focal point positions of the electron optical systems configured to include these electromagnetic lenses. The blanking control unit 206 controls the voltage to be applied to a blanking electrode 127 to deflect the electron beam EB having been generated before the start of exposure on the screening plate 115, thereby preventing the substrate from being irradiated with the electron beam EB before the exposure.

The substrate deflection control unit 207 controls the voltage to be applied to the fifth electrostatic deflector 119 and the amount of current into the electromagnetic deflector 120 so that the electron beam EB is deflected on a predetermined position of the substrate. The abovementioned respective units 202 to 207 are integrally controlled by the integral control system 26 such as a work station.

Figure 9A:
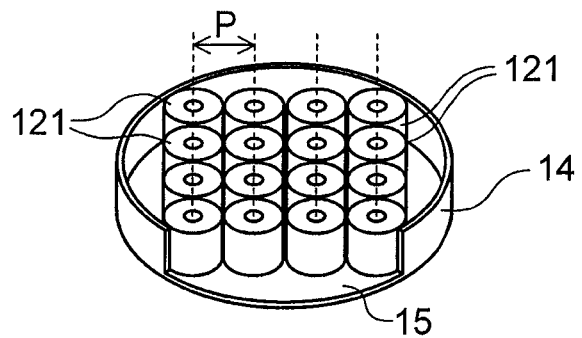
FIG. 9A is a view illustrating an arrangement of a plurality of electromagnetic lenses mounted on the electron beam exposure apparatus in FIG. 7.
Figure 9B:
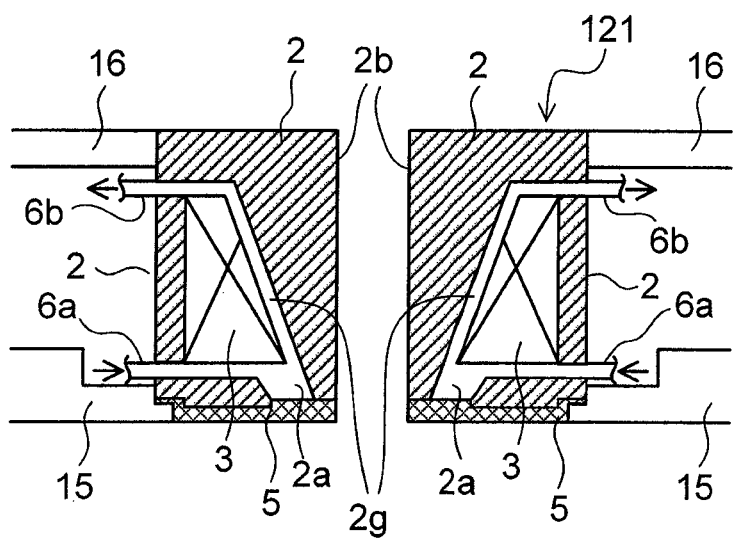
FIG. 9B is a cross-sectional view of the electromagnetic lenses in FIG. 9A.

FIG. 9A is a view illustrating the electromagnetic lenses 121 mounted on the multi-column electron beam exposure apparatus in FIG. 7, and FIG. 9B is a cross-sectional view of one of the electromagnetic lenses 121 in FIG. 9A.

As illustrated in FIG. 9A, the electromagnetic lenses 121 are disposed in parallel in a housing 14 which houses the respective column cells. The housing 14 has a diameter of about 150 [mm], and a pitch P which is an arrangement interval between the electromagnetic lenses 121 is set depending on the number of the column cells to be disposed.

For example, when four (2×2) pieces of column cells are disposed in the housing 14, the pitch P between the electromagnetic lenses 121 becomes 66 [mm], and when nine (3×3) pieces of column cells are disposed therein, the pitch P becomes 44 [mm]. Moreover, when 16 (4×4) pieces of column cells are disposed in the housing 14 as illustrated in the drawing, the pitch between the electromagnetic lenses 121 becomes approximately 33 [mm]. The outer diameter of the electromagnetic lens 121 is required to be downsized smaller than the pitch P.

As illustrated in FIG. 9B, the electromagnetic lens 121 is positioned and held in the housing 14 via holding plates 15 and 16. The electromagnetic lens 121 according to the embodiment is provided with the pole piece 2 having the nearly same shape as that of the pole piece 2 of the electromagnetic lens 4 illustrated in FIG. 4. Further, the electromagnetic coil 3 having a trapezoidal cross section is disposed in the coil housing unit 2f of the pole piece 2.

The electromagnetic lens 121 according to the embodiment is provided with a coolant flow path 2g between the electromagnetic coil 3 and the pole piece 2, and a coolant, for example cooling water, can flow through the coolant flow path 2g. In addition, the gap 2a of the pole piece 2 is filled with a sealing member 5 made of a nonmagnetic material, thereby preventing the coolant from overflowing.

An inlet 6a is provided at one end of the coolant flow path 2g, and an outlet 6b is provided at the other end of the coolant flow path 2g. The inlet 6a and the outlet 6b are connected to a circulation cooling mechanism (not illustrated). The coolant supplied from the circulation cooling mechanism circulates through the coolant flow path 2g to cool the electromagnetic coil 3.

The magnetic saturation is unlikely to occur in the electromagnetic lens 121 according to the embodiment described above because the electromagnetic lens 121 is provided with the pole piece 2 similar to the pole piece of the electromagnetic lens illustrated in FIG. 4. Thus, even if the outer diameter of the electromagnetic lens 121 is reduced, the length of the pole piece 2 in the optical axis direction is increased to achieve the increased volumetric capacity of the electromagnetic coil 3, thereby allowing the heat generation by the electromagnetic coil 3 to be reduced.

(Third Embodiment)

Figure 10:
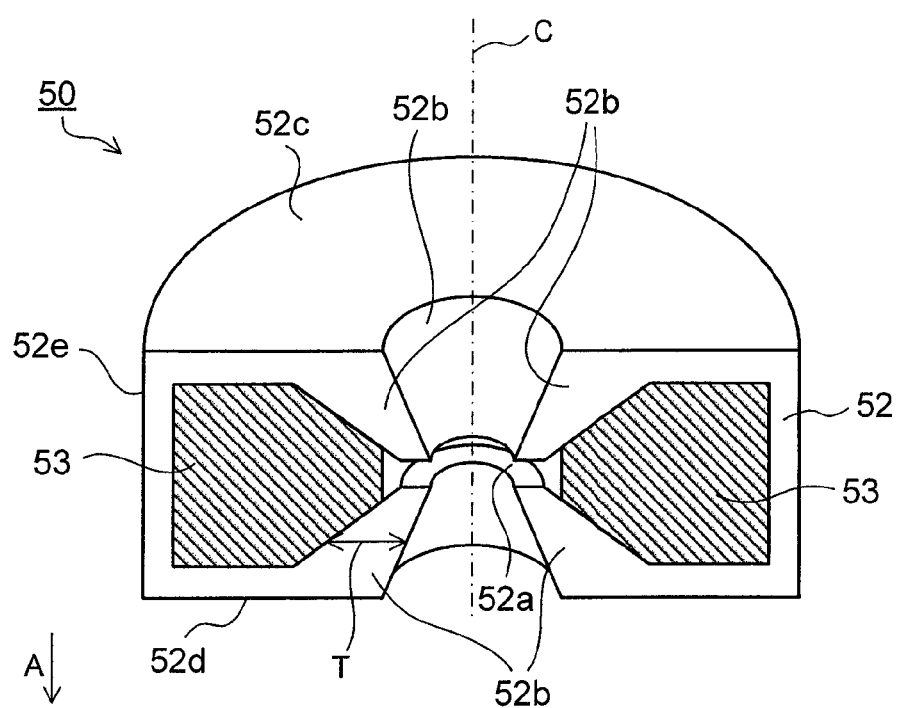
FIG. 10 is a perspective view illustrating an electromagnetic lens according to a third embodiment.

FIG. 10 is a perspective view illustrating an electromagnetic lens 50 according to a present embodiment. Note that, the electromagnetic lens illustrated in the drawing is taken along a plane in parallel with the optical axis c of the electron beam for easy understanding of the inner structure, and is actually formed to be rotationally symmetrical about the optical axis c of the electron beam. Further, an arrow in the drawing indicates the emission direction of the electron beam.

As illustrated in the drawing, the electromagnetic lens 50 is provided with an electromagnetic coil 53 formed to be rotationally symmetrical about the optical axis c, and a pole piece 52 which covers the electromagnetic coil 53. The pole piece 52 according to the embodiment includes a gap 52a formed at the central portion in the optical axis direction of an inner wall 52b which is formed around the optical axis c.

The inner wall 52b is formed such that a portion in the vicinity of the gap 52a protrudes to the optical axis side. Accordingly, the electromagnetic lens 50 can form a magnetic field having the maximum value at the central portion in the direction of the optical axis c, and can be preferably used for parts other than objective lenses.

Moreover, the thickness (thickness of a portion T in the drawing) of the inner wall 52b of the pole piece 52 in the radial direction of the optical axis c increases as being away from the gap 52a. Accordingly, the magnetic saturation is unlikely to occur in the inner wall 52b.

Moreover, in the electromagnetic coil 53, a portion near the gap 52a is formed in a convex shape protruding to the optical axis side of the electron beam along the shape of the inner wall 52b.

In this manner, the portion of the electromagnetic coil 53 near the gap portion is formed in the convex shape along the shape of the pole piece 52 to increase the cross-section area $S_O$, thereby making it possible to increase the winding number with the increased cross-section area.

In addition, since the electromagnetic coil 53 is formed in the convex shape protruding to the optical axis c, the average length $L_O$ of one turn of the winding of the electromagnetic coil 53 is shorter than in a case where the electromagnetic coil 53 is formed in a non-convex shape.

When the magnetomotive force of the electromagnetic coil 53 is N [A·T] (ampere-turn) and the resistivity of the winding is ρ, the amount of heat generated by the coil unit is in proportion to $\rho(L_O/S_O)(N)^2$. In other words, the amount of heat generated by the electromagnetic coil 53 is proportional to the average length $L_o$ of the winding, and inversely proportional to the cross-section area $S_0$ in the electromagnetic coil 53, under a condition with a constant magnetomotive force.

Accordingly, in the electromagnetic coil 53 according to the embodiment, the portion near the gap 52$a$ formed in the convex shape protruding to the optical axis c results in decrease in the winding $L_0$ and increase in the cross-section area $S_0$, thereby allowing the amount of heat generated by the electromagnetic coil 53 to be reduced.

What claimed is:

1. An electromagnetic lens comprising:
    an electromagnetic coil wound to be rotationally symmetrical about an optical axis of an electron beam; and
    a pole piece including an inner wall covering an inner circumference side of the electromagnetic coil, an upper end wall covering the electromagnetic coil at an entering side of the electron beam, a lower end wall covering the electromagnetic coil at an emitting side of the electron beam, an outer wall covering an outer circumference side of the electromagnetic coil, and a gap formed by cutting out at least a part of the inner wall, the lower end wall, and the upper end wall to be rotationally symmetrical about the optical axis,
    wherein a thickness of the inner wall is thinnest at a portion close to the gap, and gradually becomes thicker as a distance from the gap increases, and a width of the electromagnetic coil in a radial direction is more increased as being closer to the gap.

2. The electromagnetic lens according to claim 1, wherein the thickness of the thickest portion of the inner wall is thicker than a thickness of the outer wall.

3. The electromagnetic lens according to claim 1, wherein the gap is formed in at least a part of the inner wall, the lower end wall, and the upper end wall, and
    a surface of the inner wall on an optical axis side is in parallel with the optical axis, and a surface of the inner wall on an electromagnetic coil side slants to be closer to the optical axis as extending toward the gap.

4. The electromagnetic lens according to claim 3, wherein the electromagnetic coil has a trapezoidal cross section taken along a plane in parallel with the optical axis.

5. The electromagnetic lens according to claim 3, wherein at least the part of the inner wall and the lower end wall with the gap formed therein is disposed to be opposed to a surface of a sample where an image of the electron beam is to be formed.

6. The electromagnetic lens according to claim 1, wherein the gap is formed at a center of the inner wall.

7. The electromagnetic lens according to claim 1, wherein a clearance between the pole piece and the electromagnetic coil is a flow path for a coolant.

8. The electromagnetic lens according to claim 7, wherein the gap in the pole piece is sealed with a sealing member made of a nonmagnetic material.

9. An electron beam exposure apparatus comprising an electromagnetic lens,
    wherein the electromagnetic lens includes:
        an electromagnetic coil wound to be rotationally symmetrical about an optical axis of an electron beam; and
        a pole piece including an inner wall covering an inner circumference side of the electromagnetic coil, an upper end wall covering the electromagnetic coil at an entering side of the electron beam, a lower end wall covering the electromagnetic coil at an emitting side of the electron beam, an outer wall covering an outer circumference side of the electromagnetic coil, and a gap formed by cutting out at least a part of the inner wall, the lower end wall, and the upper end wall to be rotationally symmetrical about the optical axis,
        wherein a thickness of the inner wall is thinnest at a portion close to the gap, and gradually becomes thicker as a distance from the gap increases, and a width of the electromagnetic coil in a radial direction is more increased as being closer to the gap.

10. The electron beam exposure apparatus according to claim 9, further comprising:
    a plurality of electron guns configured to emit electron beams, and
    a plurality of the electromagnetic lenses on optical axes of the respective electron beams.

* * * * *